US007383625B2

(12) United States Patent
Choi et al.

(10) Patent No.: US 7,383,625 B2
(45) Date of Patent: Jun. 10, 2008

(54) METHOD OF MANUFACTURING CONTINUOUS DISK WINDING FOR HIGH-VOLTAGE SUPERCONDUCTING TRANSFORMERS

(75) Inventors: Kyeong Dal Choi, Seoul (KR); Woo Seok Kim, Seoul (KR); Seung Wook Lee, Ansan-si (KR); Young In Hwang, Seoul (KR)

(73) Assignee: Korea Polytechnic University (KR)

( * ) Notice: Subject to any disclaimer, the term of this patent is extended or adjusted under 35 U.S.C. 154(b) by 74 days.

(21) Appl. No.: 11/413,303

(22) Filed: Apr. 28, 2006

(65) Prior Publication Data

US 2007/0152786 A1 Jul. 5, 2007

(30) Foreign Application Priority Data

Dec. 30, 2005 (KR) ..................... 10-2005-0134736

(51) Int. Cl.
*H01L 39/24* (2006.01)

(52) U.S. Cl. ........................ 29/599; 335/216; 505/430; 505/433; 505/879

(58) Field of Classification Search ................ 335/216; 29/599; 336/DIG. 1; 505/430, 433, 879, 505/880
See application file for complete search history.

(56) References Cited

U.S. PATENT DOCUMENTS 5,293,524 A * 3/1994 Mookerjee et al. ......... 335/216
5,332,988 A * 7/1994 Zhukovsky et al. ........ 335/216
6,601,289 B1 * 8/2003 Kobayashi ................... 29/599

* cited by examiner

*Primary Examiner*—Ramon M. Barrera
(74) *Attorney, Agent, or Firm*—Cantor Colburn LLP

(57) ABSTRACT

Disclosed is a method of manufacturing a continuous disk winding. A high-temperature superconducting wire is lapped using Kapton films to insulate the high-temperature superconducting wire. The high-temperature superconducting wire is wound on a bobbin by a predetermined number of turns to form a layer of windings. An annular disk having a slit formed therein is fitted onto the bobbin. The slit is formed along the circumference of the disk and to be inclined from the inner side of the disk towards the outer side thereof. The high-temperature superconducting wire is inserted into the slit of the disk to pass through the annular disk smoothly along the inclined slit and wound again by the predetermined number of turns to form a next layer of windings. The above steps of fitting an annular disk, and inserting and winding the high-temperature superconducting wire are repeated to form multiple layers of windings.

4 Claims, 6 Drawing Sheets

(A)

(B)

(A)

(B)

METHOD OF MANUFACTURING CONTINUOUS DISK WINDING FOR HIGH-VOLTAGE SUPERCONDUCTING TRANSFORMERS

BACKGROUND OF THE INVENTION

1. Field of the Invention

The present invention relates to a method of manufacturing a high-temperature superconducting winding, and, more particularly, to a method of manufacturing a continuous disk winding for high-voltage superconducting transformers that has special features of no joint and low loss, which are advantages of a layer winding, while being formed in the shape of a disk winding, which is advantageous in voltage distribution and insulation.

2. Description of the Related Art

Transformers are being recognized as the first application that can be put to practical use among currently developed high-temperature superconducting power equipment. Most high-temperature superconducting transformers recently researched and developed domestically and abroad are based on high voltage and large capacity. Depending upon the shape of winding, a high-temperature superconducting winding constituting such high-temperature superconducting transformers is generally classified as a solenoid type layer winding as shown in FIG. 1A or as a disk winding, which is widely adopted as a winding using a high-temperature superconducting wire made of a general tape formed in double pan cake type, as shown in FIG. 1B. The winding shape of most high-temperature superconducting transformers currently developed all over the world is the layer winding. On the other hand, the disk winding has not been much developed. This is because alternating current loss is less when the winding of the same high-temperature superconducting transformer is manufactured in the shape of the layer winding than when the winding of the same high-temperature superconducting transformer is manufactured in the shape of the disk winding.

For a superconducting wire used in developing the high-temperature superconducting power equipment, alternating current loss is generated due to an alternating magnetic field. Especially, the superconducting wire is very weak with relation to the magnetic field applied perpendicular to the surface of the superconducting wire. For this reason, it is a general trend to adopt the high-temperature superconducting winding manufactured in the layer shape in order to reduce loss and prevent decrease of efficiency.

In the case of the high-voltage transformer, the layer winding reduces the alternating current loss generated in the superconducting wire. However, the layer winding is disadvantageous in the terms of insulation. Furthermore, the capacitance of the high-voltage transformer is small, and therefore, the high-voltage transformer is vulnerable to voltage spikes. For this reason, the high-voltage transformer using a copper wire uses the disk winding.

The disk winding is more advantageous, in terms of voltage distribution and insulation, than the layer winding as the terminal voltage of the transformer is increased. In a transformer, to which high voltage is applied as in a power-transmission transformer, it is generally preferable to adopt the disk winding. In the case that the disk winding is applied to the high-temperature superconducting transformer, however, it is necessary to electrically connect the disks with each other, and a great loss is generated in such electrical connections. Consequently, the stability of the superconducting winding is reduced, and it results in high costs to cool the high-temperature superconducting transformer.

In spite of the above-mentioned drawbacks, however, the adoption of the disk winding as the winding for high-temperature superconducting transformers is urgently requested considering high voltage, which is a current trend of developing the high-temperature superconducting power equipment.

SUMMARY OF THE INVENTION

Therefore, the present invention has been made in view of the above problems, and it is an object of the present invention to provide a method of manufacturing a continuous disk winding for high-voltage superconducting transformers that has special features of no joint and low loss, which are advantages of a layer winding, while being formed in the shape of a disk winding, which is advantageous in voltage distribution and insulation.

The continuous disk winding is manufactured by winding a high-temperature superconducting wire in the shape of a disk such that the winding is continuously carried out without joining, thereby reducing the reduction in efficiency of the wire due to the joining and reducing loss of the wire. The continuous disk winding is more advantageous, in terms of insulation, than the layer winding, and therefore, the continuous disk winding can be applied to a high-voltage transformer. Furthermore, the continuous disk winding has technical characteristics advantageous in controlling voltage stress. Consequently, development of the above-described continuous disk winding is strongly requested.

In accordance with the present invention, the above and other objects can be accomplished by the provision of a method of manufacturing a continuous disk winding for high-voltage superconducting transformers, comprising the steps of: lapping a high-temperature superconducting wire using Kapton films to apply multiple layers of insulation around the high-temperature superconducting wire; fixing one end of the high-temperature superconducting wire to a current inlet terminal of a bobbin, to the lower end of which is attached a fixing plate, which has the current inlet terminal, and winding the high-temperature superconducting wire on the bobbin by a predetermined number of turns; fitting a disk having a slit formed therein onto the bobbin to form high-temperature superconducting wire layers; inserting the high-temperature superconducting wire into a front end of the slit of the fitted disk and moving the high-temperature superconducting wire to a rear end of the slit such that the high-temperature superconducting wire can be wound on the next layer by the predetermined number of turns; fitting a plurality of disks, each of which has a slit formed therein, onto the bobbin at predetermined intervals to form a plurality of high-temperature superconducting wire layers, and repeatedly winding the high-temperature superconducting wire for each disk such that the high-temperature superconducting wire is wound from one end of the bobbin to the other end of the bobbin; and after the winding operation is completed, fixing the other end of the high-temperature superconducting wire to a current inlet terminal of another fixing plate attached to the upper end of the bobbin.

Preferably, the high-temperature superconducting wire is a BSCCO (Bi—Sr—Ca—Cu—O)-2333 based wire or a YBCO coated conductor based wire, which is a second-generation superconducting wire.

Preferably, the thickness of each disk, which is used to separate the high-temperature superconducting wire located between the respective disks from each other, is equal to the thickness of the high-temperature superconducting wire.

Preferably, the number of the disks and the number of turns of the high-temperature superconducting wire are changed depending upon the capacity of the high-voltage superconducting transformer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the accompanying drawings.

Figure 1:
FIGS. 1A and 1B are views respectively illustrating methods of winding high-temperature superconducting wires.
Figure 1:
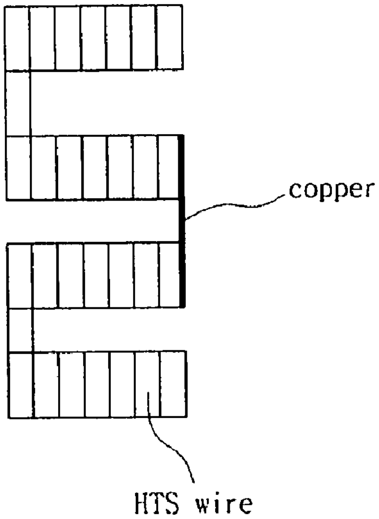
Figure 2:
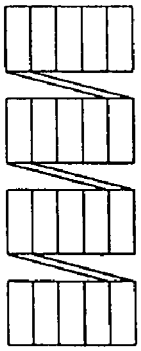
FIG. 2 is a view illustrating a continuous disk winding for high-voltage superconducting transformers according to the present invention.
Figure 3:
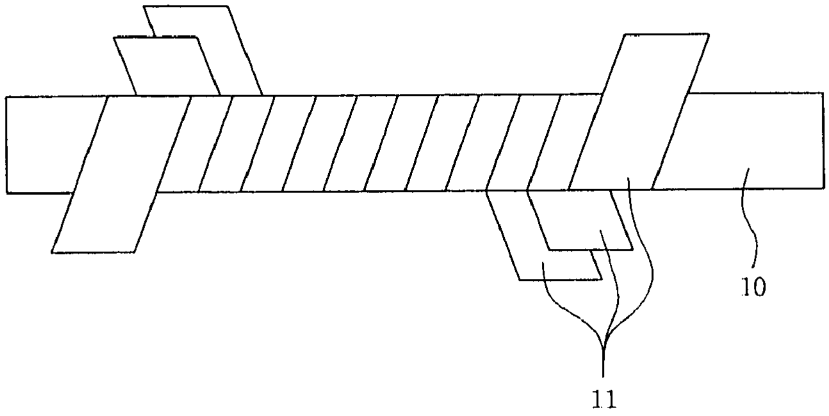
FIG. 3 is a view illustrating a method of insulating a high-temperature superconducting wire according to the present invention.
Figure 4:
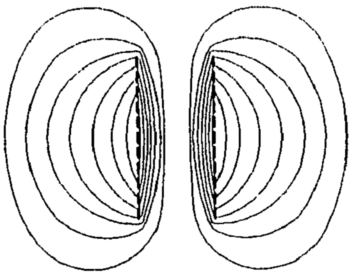
FIG. 4A is a view illustrating the distribution of a magnetic field in a continuous disk winding according to the present invention.
FIG. 4B is a view illustrating the distribution of a magnetic field in a conventional disk winding.
Figure 4:
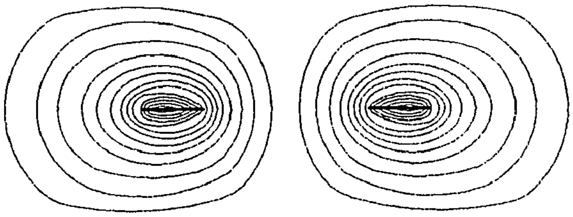
Figure 5:
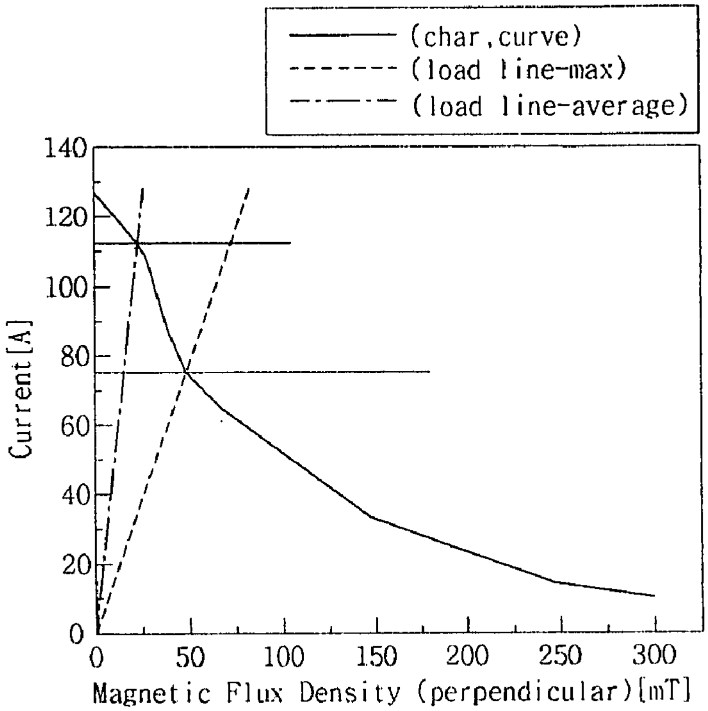
FIG. 5 is a graph illustrating the relationship between current and a magnetic field for estimating critical current according to the present invention.
Figure 6:
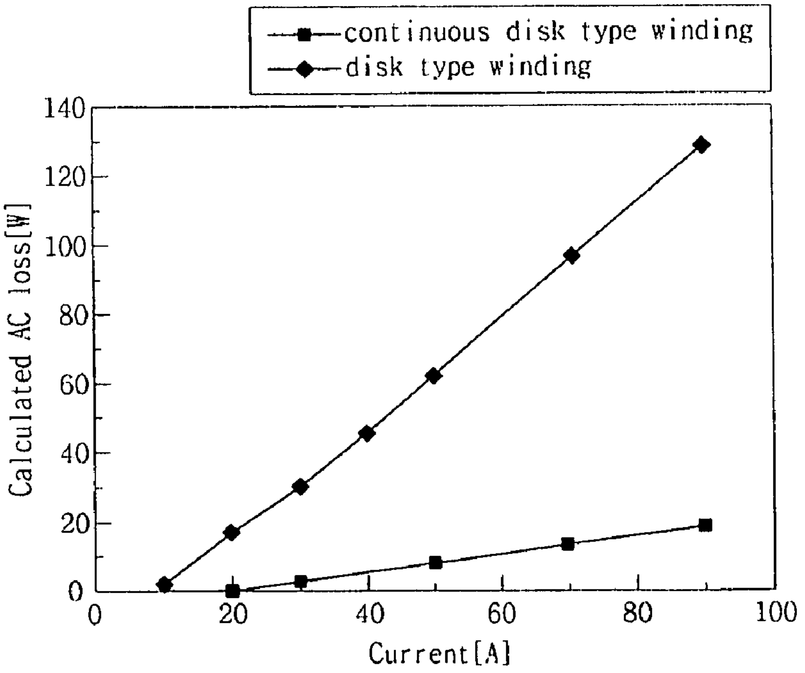
FIG. 6 is a graph illustrating the comparison between alternating current loss of a continuous disk winding according to the present invention and alternating current loss of a conventional disk winding.
Figure 7:
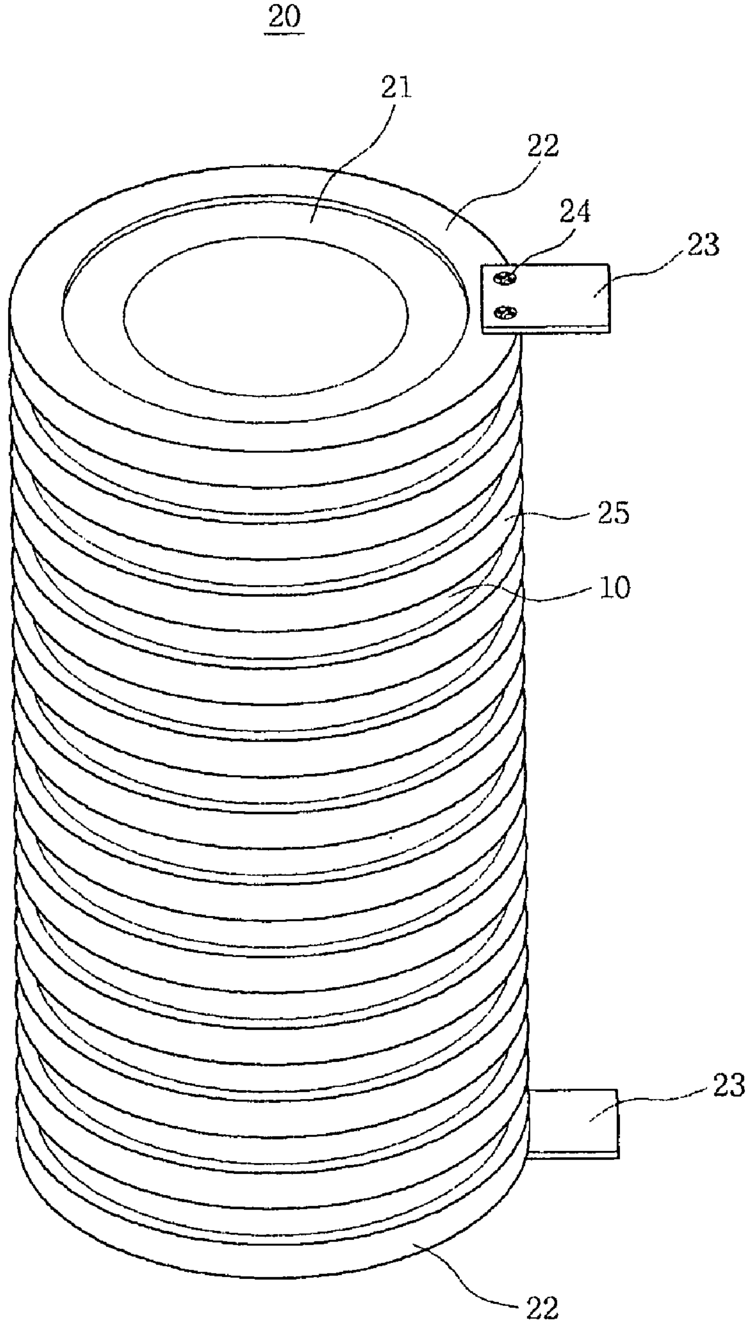
FIG. 7 is a perspective view illustrating a continuous disk winding for high-voltage superconducting transformers according to the present invention.
Figure 8A:
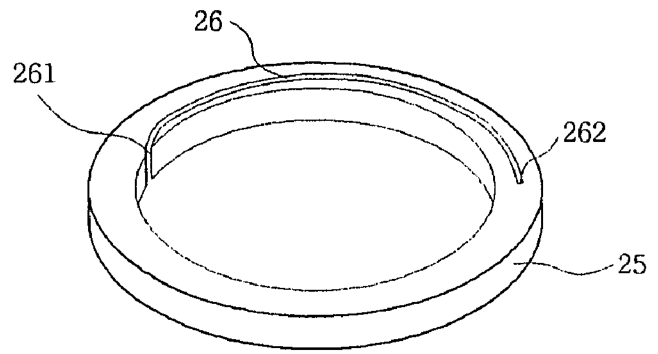
FIG. 8A is a perspective view illustrating the shape of a disk according to the present invention.
Figure 8B:
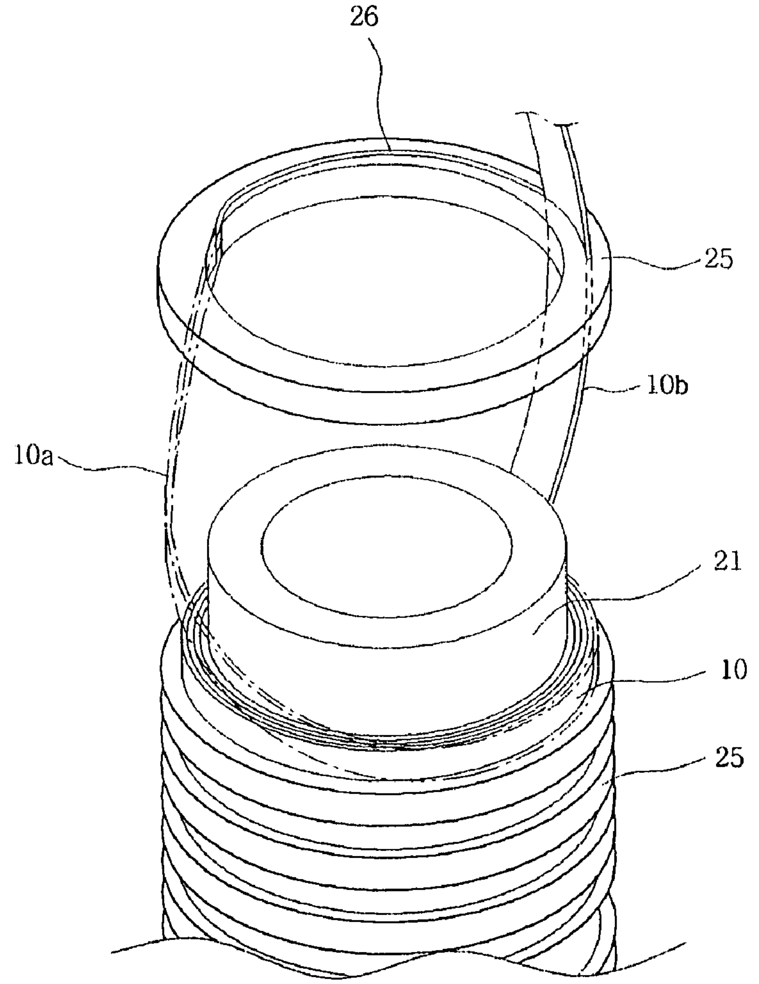
FIG. 8B is a view illustrating a method of manufacturing a continuous disk winding for high-voltage superconducting transformers according to a preferred embodiment of the present invention.
Figure 9:
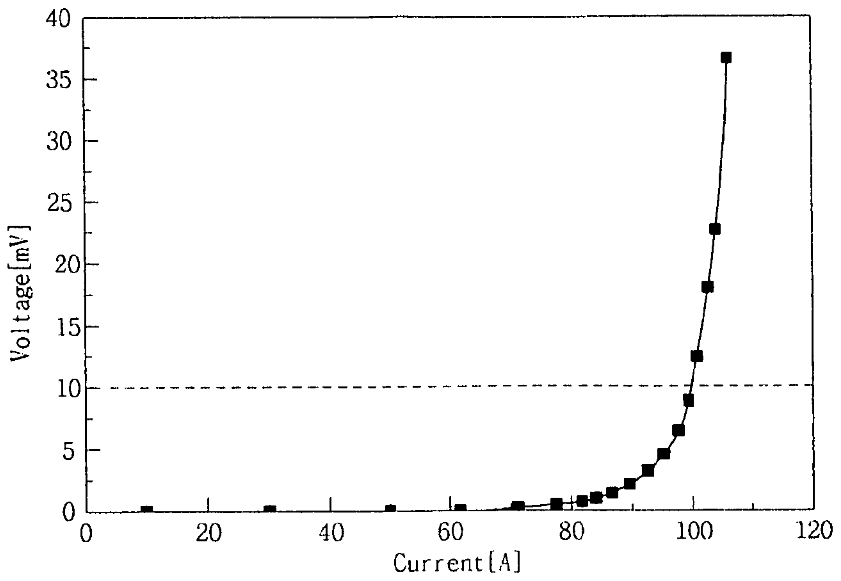
FIG. 9 is a graph illustrating the results of a test for measuring critical current of a continuous disk winding according to the present invention.

FIG. 2 is a view illustrating a continuous disk winding for high-voltage superconducting transformers according to the present invention, FIG. 3 is a view illustrating a method of insulating a high-temperature superconducting wire according to the present invention, FIG. 4A is a view illustrating the distribution of a magnetic field in a continuous disk winding according to the present invention, FIG. 4B is a view illustrating the distribution of a magnetic field in a conventional disk winding, FIG. 5 is a graph illustrating the relationship between current and a magnetic field for estimating critical current according to the present invention, FIG. 6 is a graph illustrating the comparison between alternating current loss of a continuous disk winding according to the present invention and alternating current loss of a conventional disk winding, FIG. 7 is a perspective view illustrating a continuous disk winding for high-voltage superconducting transformers according to the present invention, FIG. 8A is a perspective view illustrating the shape of a disk according to the present invention, FIG. 8B is a view illustrating a method of manufacturing a continuous disk winding for high-voltage superconducting transformers according to a preferred embodiment of the present invention, and FIG. 9 is a graph illustrating the results of a test for measuring critical current of a continuous disk winding according to the present invention.

A continuous disk winding for high-voltage superconducting transformers according to the present invention is illustrated in FIG. 2.

A high-temperature superconducting (HTS) wire 10 is threefold insulated by Kapton films 11, as shown in FIG. 3.

Referring to FIG. 7, one end of the high-temperature superconducting wire 10, which is threefold insulated by Kapton films 11, is fixed to a current inlet terminal 23 of a bobbin, to the lower end of which is attached a fixing plate 22, to which the current inlet terminal 23 is coupled by means of bolts 24, and then, the high-temperature superconducting wire 10 is wound on the bobbin by the predetermined number of turns. The bobbin 21 is hollow from one end to the other end.

In order to form high-temperature superconducting wire layers, a disk 25 including a slit 26, which has a front end 261 and a rear end 262, is fitted onto the bobbin 21. The high-temperature superconducting wire 10, which has been wound by the predetermined number of turns, is inserted into the front end 261 of the slit 26, and is then moved to the rear end 262 of the slit 26. Subsequently, the high-temperature superconducting wire 10 is wound on the next layer by the predetermined number of turns.

As described above, a plurality of disks 25, each of which includes a slit 26, are fitted on the bobbin 21 at predetermined intervals to form a plurality of high-temperature superconducting wire layers, and the high-temperature superconducting wire 10 is wound by the same number of turns for each disk 25. In this way, the high-temperature superconducting wire 10 is wound from one end of the bobbin 21 to the other end of the bobbin 21.

After the high-temperature superconducting wire 10 is wound from one end of the bobbin 21 to the other end of the bobbin 21, another fixing plate 22, to which an current inlet terminal 23 is coupled by means of bolts 24, is attached to the upper end of the bobbin 21, and then the other end of the high-temperature superconducting wire 10 is fixed to the current inlet terminal 23.

The number of the disks 25 and the number of turns of the high-temperature superconducting wire 10 are changed depending upon the capacity of a high-voltage superconducting transformer. According to the present invention, a BSCCO (Bi—Sr—Ca—Cu—O)-2333 based wire, which is currently commercialized and widely used, or a YBCO coated conductor based wire, which is a second-generation superconducting wire, may be selectively used as the high-temperature superconducting wire 10. Preferably, the high-temperature superconducting wire 10 has the following specification, which is indicated in Table 1 below.

TABLE 1

Specification of High-temperature Superconducting Wire

| Specification | Value |
| --- | --- |
| Thickness | 0.5 mm |
| Width | 5 mm |
| Critical Tensile Stress | 265 MPa |
| Minimum Bending Diameter | 50 mm |
| Critical Current | 126 A |

In order to apply the high-temperature superconducting wire 10 indicated in Table 1 to the high-voltage superconducting transformer, the high-temperature superconducting wire 10 is threefold insulated by the Kapton films in the same manner as shown in FIG. 3, and then a continuous disk winding is manufactured using the insulated high-temperature superconducting wire 10. The specification of the continuous disk winding is indicated in detail in Table 2 below.

TABLE 2

Specification of Continuous Disk Winding

| Specification | Value |
| --- | --- |
| Length of HTS Wire | 61.78 m |
| Inner Diameter | 170 mm |
| Outer Diameter | 180 mm |
| Height of Winding | 225 mm |
| Number of Disks | 23 |
| Number of Turns | 115 |

The total length of the high-temperature superconducting wire 10 used is approximately 61 m, the number of turns is 115, the outer diameter of the winding is 180 mm, and the height of the winding is 225 mm. A continuous disk winding and a conventional disk winding having the same number of turns as the continuous disk winding were modeled based on the design values indicated in Table 2 so as to analyze static magnetic fields of the continuous disk winding and the conventional disk winding. The static magnetic field analysis results are shown in FIGS. 4A and 4B.

A method used for analysis was an axial-symmetry modeling method using a flexible element method. In comparison between the distribution of the magnetic field in the continuous disk winding and the distribution of the magnetic field in the conventional disk winding, it can be seen that the component of the magnetic field applied perpendicular to the surface of the high-temperature superconducting wire in the case of the conventional disk winding as shown in FIG. 4B is increased as compared to the case of the continuous disk winding as shown in FIG. 4A. As the perpendicular component of the magnetic field is increased, the efficiency of the high-temperature superconducting wire is sharply decreased, and furthermore, alternating current loss is sharply increased. Consequently, it can be seen that the continuous disk winding is preferable. For example, when the current flowing through the coil is 70 A, the maximum value of magnetic field is 70 mT and the maximum value of magnetic field in the perpendicular direction is 68.5 mT in the case of the continuous disk winding. On the other hand, the maximum value of magnetic field is 68.5 mT and the maximum value of magnetic field in the perpendicular direction is 130 mT in the case of the conventional disk winding. As can be seen from the above comparison, as the magnetic field applied perpendicular to the disk winding is increased, critical current is sharply decreased, and alternating current loss is sharply increased.

In the case of the continuous disk winding designed based on the above-described static magnetic field analysis results, the critical current of the continuous disk winding is estimated with reference to the change of the critical current depending upon the magnetic flux density applied perpendicular to the high-temperature superconducting wire and the load lines of the designed continuous disk winding as shown in FIG. 5.

Two lines shown in FIG. 5 are load lines formed by the maximum magnetic flux density and the average magnetic flux density applied perpendicular to the high-temperature superconducting wire. Since the maximum perpendicular magnetic field is only partially applied to the high-temperature superconducting wire, the critical current of the real winding is present between two critical currents estimated by the load lines. When the average magnetic field is applied perpendicular to the high-temperature superconducting wire, the estimated value of the critical current is 112 A. When the maximum magnetic field is applied perpendicular to the high-temperature superconducting wire, on the other hand, the estimated value of the critical current is 73 A. Consequently, the critical current of between 73 A and 112 A is measured for the real winding.

FIG. 6 is a graph illustrating the comparison between alternating current losses generated depending upon currents applied to the two types of high-temperature superconducting wire as shown in FIG. 4. The calculated alternating current loss is a magnetization loss depending upon the applied current when alternating current of 60 Hz is applied in the case that the operation temperature is 77 K. It can be seen that the continuous disk winding generates the alternating current loss less than that of the conventional disk winding having the same number of turns as the continuous disk winding. The conventional disk winding, which is designed to compare with the continuous disk winding, is manufactured using only one disk. When the conventional disk winding is manufactured using a plurality of disks, on the other hand, resistance losses, which are generated at the connected parts of the disks, are further generated, and therefore, the losses are increased.

In the continuous disk winding manufactured based on the above-described design, the high-temperature superconducting wire is wound by five turns for each disk 25, and the high-temperature superconducting wire is continuously wound for all of the disks, which is 23 in number. The total length of the high-temperature superconducting wire 10 used in the winding is approximately 61 m. The high-temperature superconducting wire 10 is threefold insulated before the high-temperature superconducting wire is used. For insulating tests, two sheets of Nomax tape are disposed between the turns to reinforce the insulation. Also, the thickness of each disk 25, which is used to separate the high-temperature superconducting wire 10 located between the respective disks 25 from each other, is equal to the thickness of the high-temperature superconducting wire 10. The material of the bobbin 21 is made of glass fiber reinforced plastic (GFRP), which has high mechanical characteristics and electrical insulation characteristics at low temperature. FIG. 7 is a perspective view illustrating a continuous disk winding 20 for high-voltage superconducting transformers, which is manufactured as described above. The two current inlet terminals 23 are attached to the opposite fixing plates for measuring the critical current and the alternating current loss.

FIG. 8A is a perspective view illustrating the shape of a disk according to the present invention. The disk 25 has a front end 261 formed at the inner circumferential surface thereof. From the front end 261, the slit 26 extends along the disk 25 by an angular distance of 180 degrees with the result that a rear end 262 is formed in the disk 25. FIG. 8B is a view illustrating a method of manufacturing a continuous disk winding for high-voltage superconducting transformers according to a preferred embodiment of the present invention. In order to form high-temperature superconducting wire layers, the disk 25 including the slit 26, which has the front end 261 and the rear end 262, is fitted onto the bobbin 21. The high-temperature superconducting wire 10 is inserted into the front end 261 of the slit 26 as indicated by reference numeral 10*a*, and is then moved to the rear end 262 of the slit 26 as indicated by reference numeral 10*b*. Subsequently, the high-temperature superconducting wire 10 is wound on the next layer by the predetermined number of turns. The above winding method is repeatedly carried out.

FIG. 9 is a graph illustrating the results of a test for measuring critical current of a continuous disk winding according to the present invention. The critical current of the manufactured winding is approximately 97 A, which is within the range of the estimated values of the previously calculated critical current (73 A to 112 A). As a result, the method of manufacturing the continuous disk winding using the high-temperature superconducting wire can be applied to high-voltage superconducting transformers.

Consequently, the method of manufacturing the continuous disk winding according to the present invention can be applied particularly to a winding for high-voltage, high-temperature superconducting transformers, as a new method for accomplishing high voltage and large capacity thereof.

As apparent from the above description, the present invention provides a method of manufacturing a continuous disk winding for high-voltage superconducting transformers that has special features of no joint and low loss, which are advantages of a layer winding, while being formed in the shape of a disk winding, which is advantageous in voltage distribution and insulation. Consequently, the present invention has the effect of manufacturing a high-temperature superconducting winding without decrease of critical current and controlling voltage stress, whereby the continuous disk winding according to the present invention is applicable to high-voltage superconducting transformers.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a continuous disk winding for high-voltage superconducting transformers, comprising the steps of:

lapping a high-temperature superconducting wire using Kapton films to apply multiple layers of insulation around the high-temperature superconducting wire;

fixing one end of the high-temperature superconducting wire to a current inlet terminal of a bobbin, and winding the high-temperature superconducting wire on the bobbin by a predetermined number of turns to form a layer of windings;

fitting an annular disk having a slit formed therein onto the bobbin, the slit being formed along the circumference of the disk and to be inclined from the inner side of the annular disk towards the outer side thereof;

inserting the high-temperature superconducting wire into the slit of the disk to pass through the annular disk smoothly along the inclined slit and winding the high-temperature superconducting wire by the predetermined number of turns to form a next layer of windings;

repeating the above steps of fitting an annular disk, and inserting and winding the high-temperature superconducting wire to form multiple layers of windings; and fixing the other end of the high-temperature superconducting wire to another current inlet terminal of the bobbin.

2. The method as set forth in claim 1, wherein the high-temperature superconducting wire is a BSCCO (Bi—Sr—Ca—Cu—O)-2333 based wire or a YBCO coated conductor based wire, which is a second-generation superconducting wire.

3. The method as set forth in claim 1, wherein the thickness of each disk, which is used to separate the high-temperature superconducting wire located between the respective disks from each other, is equal to the width of the high-temperature superconducting wire.

4. The method as set forth in claim 1, wherein the number of the disks and the number of turns of the high-temperature superconducting wire are changed depending upon the capacity of the high-voltage superconducting transformer.

* * * * *